(12) United States Patent
Thompson et al.

(10) Patent No.: US 11,363,738 B2
(45) Date of Patent: Jun. 14, 2022

(54) ELECTRONIC DEVICE WITH COOLING FLUID MANIFOLD AND MULTI-FUNCTION COOLING FLUID TUBES WITH RELATED ELECTRONICS CABINET AND ASSOCIATED METHODS

(71) Applicant: EAGLE TECHNOLOGY, LLC, Melbourne, FL (US)

(72) Inventors: Jason Thompson, Melbourne, FL (US); Marcus Ni, Rockledge, FL (US); Voi Nguyen, Oviedo, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 77 days.

(21) Appl. No.: 16/916,271

(22) Filed: Jun. 30, 2020

(65) Prior Publication Data

US 2021/0410330 A1  Dec. 30, 2021

(51) Int. Cl.
*H05K 7/20* (2006.01)
*H05K 7/14* (2006.01)
*H01R 12/73* (2011.01)
*H05K 1/14* (2006.01)

(52) U.S. Cl.
CPC ....... *H05K 7/20272* (2013.01); *H01R 12/737* (2013.01); *H05K 1/14* (2013.01); *H05K 7/1439* (2013.01); *H05K 7/20263* (2013.01)

(58) Field of Classification Search
CPC ............. H05K 7/20272; H05K 7/1439; H05K 7/20263; H05K 1/14; H01R 12/737
USPC ....................................................... 361/699
See application file for complete search history.

(56) References Cited

U.S. PATENT DOCUMENTS

| | | |
|---|---|---|
| 7,042,726 B2 | 5/2006 | Cader et al. |
| 7,174,738 B2 | 2/2007 | Scott |
| 7,420,804 B2 | 9/2008 | Leija et al. |
| 7,978,472 B2 | 7/2011 | Campbell et al. |
| 8,289,710 B2 | 10/2012 | Spearing et al. |
| 10,562,469 B2 | 2/2020 | Dede |

(Continued)

FOREIGN PATENT DOCUMENTS

WO   WO2015088856   6/2015

OTHER PUBLICATIONS

VITA Approved ANSI Standard ANSI/VITA 48.Apr. 2018 Liquid Flow Through VPX Plug-In Module Standard: Copyright © VITA 2018. www.vita.com; pp. 53.

(Continued)

*Primary Examiner* — Anatoly Vortman
*Assistant Examiner* — Zhengfu J Feng
(74) *Attorney, Agent, or Firm* — Allen, Dyer, Doppelt + Gilchrist, P.A.

(57) ABSTRACT

An electronic device may include a backplane and an electrical connector carried by a front side of the backplane, and a circuit board assembly removably coupled to the electrical connector. Each circuit board assembly may include a circuit board and electronic components carried by the circuit board and generating waste heat, and a cooling fluid arrangement thermally coupled to the electronic components. The electronic device may include a cooling fluid manifold, and a pair of multi-functional tubes that provide alignment, keying, structural rigidity and fluid supply and return capabilities extending between the cooling fluid manifold and the cooling fluid arrangement.

25 Claims, 15 Drawing Sheets

(56) References Cited

U.S. PATENT DOCUMENTS

| | | | | |
|---|---|---|---|---|
| 10,701,838 B1* | 6/2020 | Conroy | ............. | H05K 7/20781 |
| 10,863,652 B1* | 12/2020 | Conroy | ............. | H05K 7/20781 |
| 2007/0223193 A1* | 9/2007 | Hamman | ........... | H05K 7/20218 |
| | | | | 361/689 |
| 2008/0066889 A1 | 3/2008 | Knight et al. | | |
| 2008/0123297 A1* | 5/2008 | Tilton | ................ | H05K 7/20345 |
| | | | | 361/700 |
| 2009/0260777 A1* | 10/2009 | Attlesey | ............. | H05K 7/20772 |
| | | | | 165/67 |
| 2010/0175852 A1 | 7/2010 | Peterson | | |
| 2011/0209855 A1 | 9/2011 | Peterson et al. | | |
| 2011/0313576 A1* | 12/2011 | Nicewonger | ........... | F28D 15/00 |
| | | | | 700/282 |
| 2013/0294028 A1* | 11/2013 | Lafont | ............... | H05K 7/20563 |
| | | | | 361/694 |
| 2016/0120019 A1 | 4/2016 | Shedd et al. | | |
| 2016/0128238 A1* | 5/2016 | Shedd | .................... | F25B 41/40 |
| | | | | 361/679.47 |

OTHER PUBLICATIONS

VITA "ANSI/VITA 48.2 Mechanical Specifications for Microcomputers Using REDI Conduction Cooling Applied to VITA VPX" Jul. 2010; pp. 53.

* cited by examiner

ELECTRONIC DEVICE WITH COOLING FLUID MANIFOLD AND MULTI-FUNCTION COOLING FLUID TUBES WITH RELATED ELECTRONICS CABINET AND ASSOCIATED METHODS

TECHNICAL FIELD

The present disclosure relates to the field of electronic devices, and, more particularly, to electronic devices with liquid cooling and related methods.

BACKGROUND

An electronic device may include one or more circuit card modules inserted into a chassis and electronically coupled to a backplane of the electronic device. A typical circuit card module includes one or more circuit boards mounted to a heat sink structure. A typical circuit board is a planar board that mechanically supports electronic components. The electronic components may comprise, for example, resistors, capacitors, switches, batteries, and other more complex integrated circuit components, for example, microprocessors. The circuit board typically comprises a dielectric material, for example, a plastic material.

A simple circuit board may include conductive traces on its surface for connecting the electronic components to each other. As electronic circuitry has become more complex, multi-layer circuit boards with at least two electrically conductive trace layers sandwiched between dielectric layers have been developed. Typically, the different conductive trace layers of the multi-layer circuit board may be connected through vertically extending vias, which comprise conductive materials, for example, metal.

A typical backplane, sometimes referred to as a motherboard, incudes conductive traces sandwiched between dielectric layers similar to the circuit board construction. The backplane may allow two or more circuit card modules to interconnect through electrically conductive pads on the major surfaces thereof. In other words, the edge surface of the circuit card module is mounted onto the major surface of the backplane at a 90 degree angle. Moreover, this interconnection is typically accomplished using an interconnector component on the major surface of the circuit card module and the backplane. Typically, the interconnector component physically couples the circuit card module and backplane together and electrically couples the electrically conductive pads.

As circuit card modules become more densely populated with heat generating components, such as processors, multi-chip modules (MCMs), radio frequency (RF) components, photonic devices and field-programmable gate arrays (FPGAs), the dissipation of the heat generated has become increasingly more important. One heat dissipation approach, which has been used in a variety of applications, including electronic circuit card modules, has been to use convection cooling techniques. With convection cooling, the circuit card modules may be mounted in the electronic device in a way that permits cooling air to flow over the circuit boards. For proper convection cooling, an adequate cooling airflow over a sufficiently exposed surface of the circuit board should be provided. Such arrangements may be incompatible, however, with some uses of circuit card modules where cooling air is not available or space is not available to allow adequate airflow over heat dissipating components.

An alternative approach is to dissipate heat through conduction. In this application, heat is transferred via a heat sink positioned on one surface of the circuit board and in contact with components on the circuit board. The heat sink includes a flange extending beyond the sides of the circuit board allowing for attachment to the cold wall of the electronic device chassis. Typically, wedge lock retainer devices are used to make the connection between the heat sink flanges and the electronic device chassis. This conduction approach is the basis of industry standards, such as VITA 48.2 and IEEE 1101.2.

Another approach is to dissipate heat via convection cooling with a liquid. In this application, heat is transferred via a heat sink positioned on one surface of the circuit board and in contact with components on the circuit board. Cooling liquid is passed within the heatsink to cool the circuit board. This approach is the basis of industry standards, such as VITA 48.4.

SUMMARY

Generally, an electronic device may comprise a backplane and an electrical connector carried by a front side of the backplane, and a circuit board assembly removably coupled to the electrical connector. The circuit board assembly may include a circuit board, a plurality of electronic components carried by the circuit board and generating waste heat, and a cooling fluid arrangement thermally coupled to the plurality of electronic components. The electronic device may comprise a cooling fluid manifold, and a pair of cooling fluid tubes extending between the cooling fluid manifold and the cooling fluid arrangement.

In some embodiments, the cooling fluid manifold may be behind a back side of the backplane. The pair of cooling fluid tubes may extend from the cooling fluid manifold through the backplane. The pair of cooling fluid tubes may be removably coupled to the cooling fluid arrangement. In other embodiments, the cooling fluid manifold may be adjacent to the front side of the backplane.

In particular, the pair of cooling fluid tubes may have keyed outer surfaces, and the circuit board assembly may comprise a pair of receptacles defining keyed passageways to receive the pair of cooling fluid tubes with matching keyed outer surfaces. The pair of cooling fluid tubes may be rotatably mounted to the cooling fluid manifold. The keyed outer surfaces and the keyed passageways may be associated with a given electronic function from among a plurality of different electronic functions based upon a selective rotation.

Additionally, the cooling fluid arrangement may comprise a heat sink defining a cooling fluid cavity therein, and a pair of cooling fluid ports extending from the heat sink and removably coupled to the pair of cooling fluid tubes. The electronic device may comprise a first fluid flow valve in each cooling fluid port to permit decoupling without fluid leakage, and a second fluid flow valve in each cooling fluid tube to permit decoupling without fluid leakage. The electronic device may include a housing surrounding the circuit board assembly and opposing guide rails carried by the housing to slidably receive the circuit board assembly.

The electronic device may further comprise a heat exchanger coupled to the cooling fluid manifold. For example, each cooling fluid tube may be adjacent to a corresponding opposite end of the electrical connector.

Another aspect is directed to an electronics cabinet (e.g., an aviation electronics cabinet). The electronics cabinet may include a backplane and a plurality of electrical connectors carried by a front side of the backplane, and a plurality of circuit board assemblies removably coupled respectively to the plurality of electrical connectors. Each circuit board assembly may include a circuit board, a plurality of electronic components carried by the circuit board and generating waste heat, and a cooling fluid arrangement thermally coupled to the plurality of electronic components. The electronics cabinet may comprise a housing surrounding the plurality of circuit board assemblies, opposing guide rails carried by the housing to slidably receive the plurality of circuit board assemblies, a cooling fluid manifold, and a plurality of cooling fluid tube pairs extending between the cooling fluid manifold and the cooling fluid arrangement.

Yet another aspect is directed to a method for making an electronic device. The method may include coupling an electrical connector to a front side of a backplane, and coupling a cooling fluid manifold to the backplane. The method may further include coupling a pair of cooling fluid tubes extending from the cooling fluid manifold, and removably coupling a circuit board assembly to the electrical connector and the pair of cooling fluid tubes. The circuit board assembly may include a circuit board and a plurality of electronic components carried thereby and generating waste heat, and a cooling fluid arrangement thermally coupled to the plurality of electronic components and removably coupled to the pair of cooling fluid tubes.

DETAILED DESCRIPTION

Figure 1:
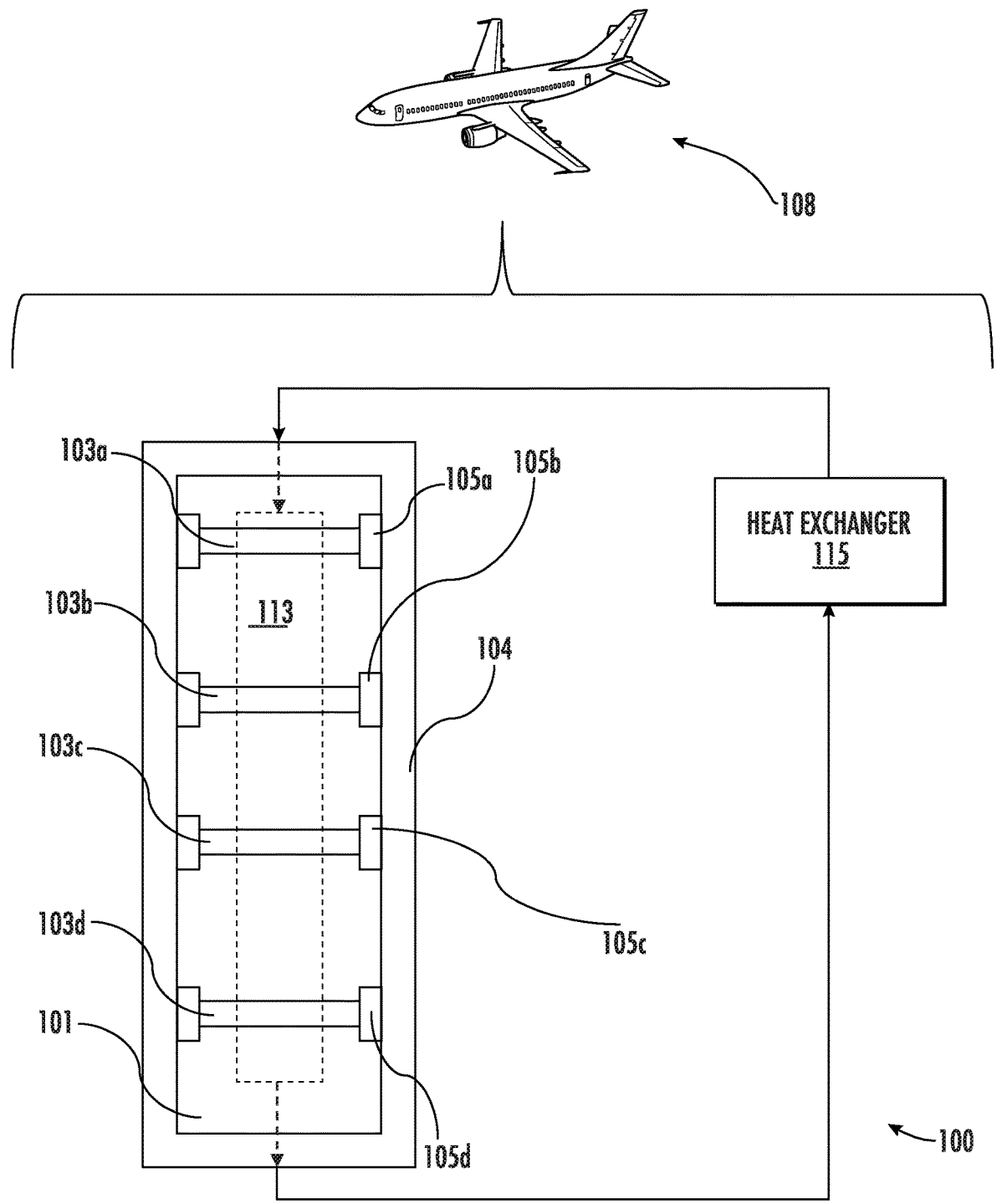
FIG. 1 is a schematic diagram of an electronics cabinet, according to the present disclosure.

Typical circuit boards are approaching the limits (e.g., 100 Watts or greater) of established thermal management capabilities. Nonetheless, future computing needs may push power consumption to well over 400 Watts. Because of this, there is a desire to transition to liquid cooling techniques, which have twice the thermal capability over typical air convection cooling approaches.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring to FIGS. 1-9, an electronics cabinet 100 according to the present disclosure is now described. For example, the electronics cabinet 100 is illustratively carried by an airborne platform 108 (i.e., an aviation electronics cabinet). Of course, this application is merely illustrative, and the electronic cabinet 100 may be used in other applications, such as marine, space, and terrestrial.

The electronics cabinet 100 illustratively includes a backplane 101, a plurality of electrical connectors 102a-102b carried by a front side (i.e., the primary side) of the backplane, and a plurality of circuit board assemblies 103a-103d removably coupled respectively to the plurality of electrical connectors. For example, and as perhaps best seen in FIGS. 5-6, each electrical connector 102a-102b illustratively comprises a rectangular shape, but can comprise other shapes in other embodiments, such as a circular connector shape.

The electronics cabinet 100 illustratively comprises a housing 104 surrounding the plurality of circuit board assemblies 103a-103d, and opposing guide rails 105a-105d carried by the housing to respectively and slidably receive the circuit board assemblies. Each circuit board assembly 103a-103d illustratively comprises a circuit board 106, a plurality of electronic components 107 carried by the circuit board and generating waste heat, and a cooling fluid arrangement 110 thermally coupled to the plurality of electronic components. The circuit board 106 comprises a dielectric layer, and a plurality of conductive traces on the dielectric layer coupled to the electronic components 107.

Further, each circuit board assembly 103a-103d illustratively comprises a pair of retainers 111a-111b, and a base plate 112 carrying the circuit board 106 (e.g., attached via fasteners). As for form factor, each circuit board assembly 103a-103d may comprise one of the following non-exhaustive exemplary board shapes: 3U Eurocard, 6U Eurocard. The pair of retainers 111a-111b provides the compressive force (i.e., contact pressure) to "retain" each circuit board assembly 103a-103d to the opposing guide rails 105a-105d carried by the housing 104. In other words, the pair of retainers 111a-111b provides mechanical retention to withstand environments. The pair of retainers 111a-111b is illustratively represented as wedge lock type retainers. Of course, in other embodiments, other forms of retention can be used.

The electronics cabinet 100 comprises a cooling fluid manifold 113 abutting and being behind a back side (i.e., the secondary side) of the backplane 101, and a plurality of cooling fluid tube pairs 114a-114d extending from the cooling fluid manifold through the backplane and removably coupled to the cooling fluid arrangement 110. In other embodiments, the cooling fluid manifold 113 may abut the front side (i.e., the primary side) of the backplane 101 (FIGS. 11-14).

Figure 5:
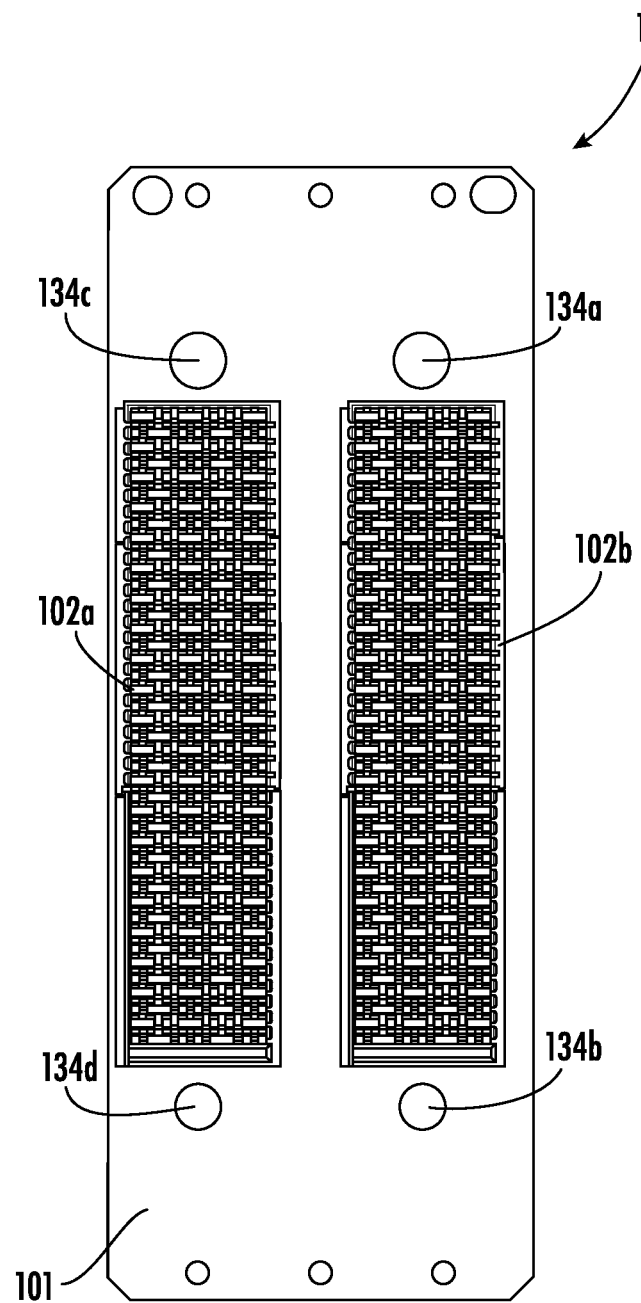
FIG. 5 is a schematic side view of the backplane of FIG. 2.
Figure 6:
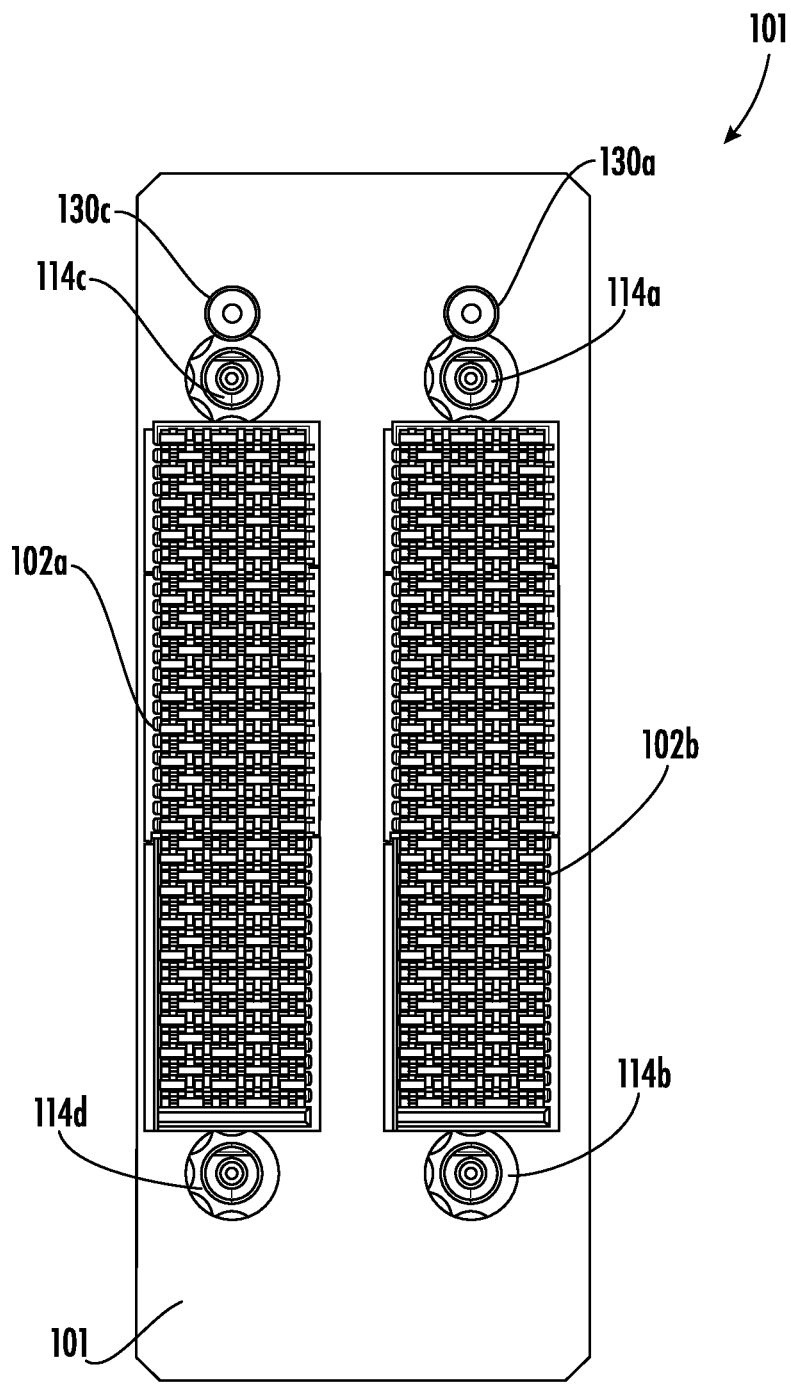
FIG. 6 is a schematic side view of the backplane and cooling fluid tube pairs of FIG. 2.

As perhaps best seen in FIGS. 5-6, each cooling fluid tube 114a-114d is adjacent to a corresponding opposite end of the electrical connector 102a-102b. In particular, the backplane 101 illustratively comprises a plurality of passageways 134a-134d respectively receiving the plurality of cooling fluid tube pairs 114a-114d.

The electronics cabinet 100 further comprises a heat exchanger 115 coupled to the cooling fluid manifold 113. Each respective pair of cooling fluid tubes 114a-114d comprises a positive flow tube providing cooling fluid from the heat exchanger 115, and a return flow tube transmitting heated fluid to the heat exchanger. As will be appreciated, the heat exchanger 115 is a generic term that comprises various elements of a pumped fluid system (i.e., the heat exchanger (typically finned structure) and air movers to convectively remove the waste heat being transported by the fluid to the heat exchanger). Additionally, in space applications, the heat exchanger 115 may comprise a thermal radiator that would reject the waste heat via radiation to space as the cooling fluid flows through it.

Additionally, as will be appreciated, the electronics cabinet 100 further comprises a fluid transfer device (not shown) to displace the cooling fluid through the heat exchanger 115. For example, the fluid transfer device may comprise a mechanical device, such as a fluid pump. In other embodiments, a passive approach may be used. For example, if low boiling dielectric fluids are used within the cooling system, the heat will boil the fluid and the vapor pressure will move it to a condensing unit of the heat exchanger 115 (i.e., a thermosiphon). Once the fluid condenses, it will continue the cyclical "pumping" nature passively without the need for mechanical pumping.

Each of the pair of cooling fluid tubes 114a-114d illustratively includes keyed outer surfaces 116. The circuit board assembly 103a-103d comprises a pair of receptacles 117a-117b defining keyed passageways 120a-120b to receive the pair of cooling fluid tubes 114a-114d with matching keyed outer surfaces. The respective pair of cooling fluid tubes 114a-114d is rotatably mounted to the cooling fluid manifold 113. The keyed outer surfaces 116 and the keyed passageways 120a-120b are associated with a given electronic function from among a plurality of different electronic functions (e.g., transceiver board, processing board) based upon a selective rotation.

Additionally, the cooling fluid arrangement 110 comprises a heat sink 121 defining a cooling fluid cavity 122 therein, and a pair of cooling fluid ports 123a-123b extending from the heat sink and removably coupled to the respective pair of cooling fluid tubes 114a-114d. Fasteners (e.g., screws) couple the base plate 112 and the heat sink 121 together. In other embodiments, the base plate 112 and heat sink 121 may be integrated, for example, machined as a single entity if providing cooling to an entire circuit card assembly or multiple dissipating components.

Figure 4:
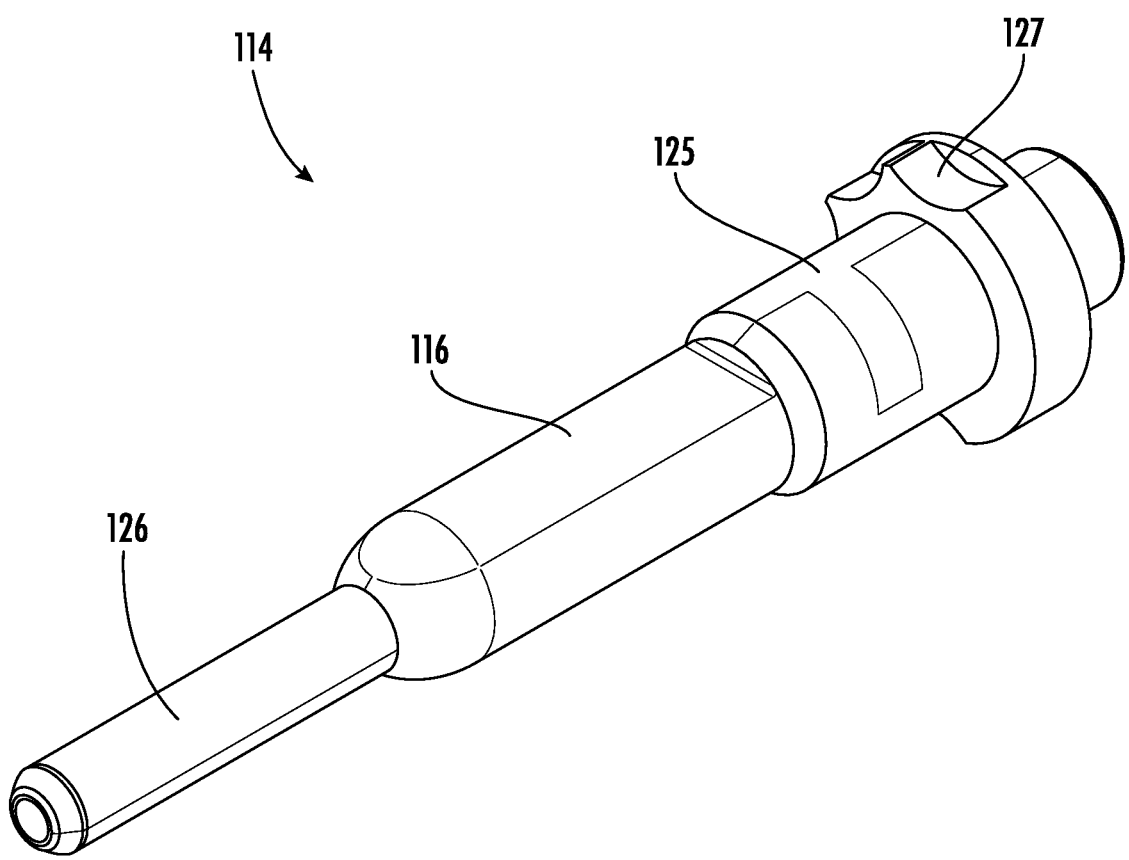
FIG. 4 is a schematic perspective view of the cooling fluid tube of FIG. 2.

As perhaps best seen in FIGS. 4 & 6, each cooling fluid tube 114a-114d has a distal end 125, and a proximal end 126 having a smaller outer cross-section than the distal end. Also, each cooling fluid tube 114a-114d illustratively includes a base with a clocking annular edge 127. In particular, in combination with the asymmetric shape of the cooling fluid tube 114a-114d, a plurality of fasteners 130a-130c couple the cooling fluid tube pairs 114a-114d to the cooling fluid manifold 113 at a set or clocked rotational alignment. In the illustrated embodiment, the clocking annular edge 127 comprises five clocked positions, but this number is merely exemplary. In this fashion, each pair of cooling fluid tubes 114a-114d is clocked to match as desired pair of receptacles 117a-117b with keyed passageways 120a-120b, which will avoid improper placement of a circuit board assembly 103a-103d.

Moreover, each pair of cooling fluid tubes 114a-114d provides additional structural support to the circuit board assembly 103a-103d, which reduces strain thereon. This may be helpful for mobile applications, such as in the exemplary illustrated airborne platform 108.

Figure 2:
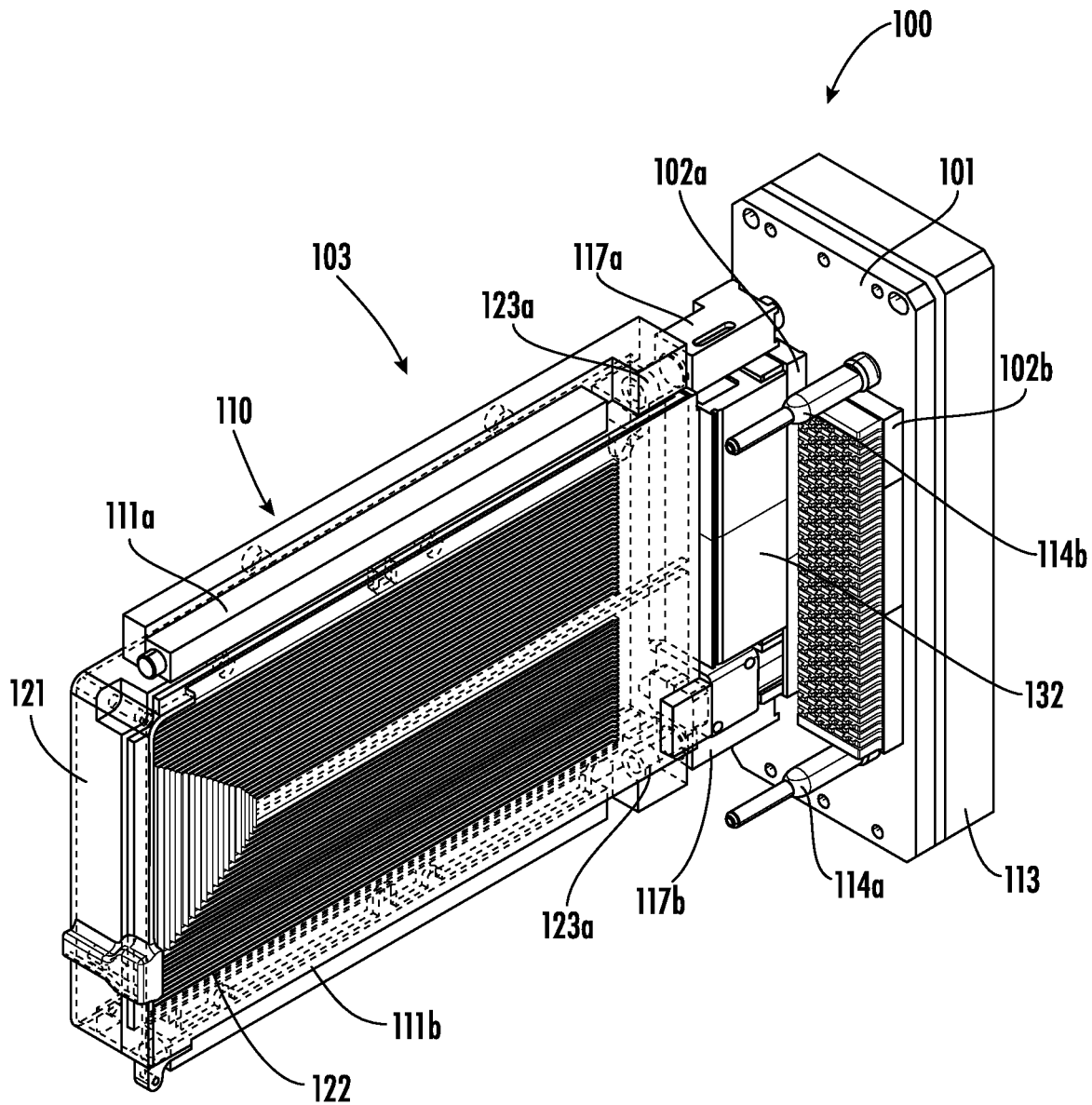
FIG. 2 is a schematic perspective view of an example embodiment of the circuit board assembly without a circuit board, and a cooling fluid arrangement from the electronics cabinet of FIG. 1.
Figure 3:
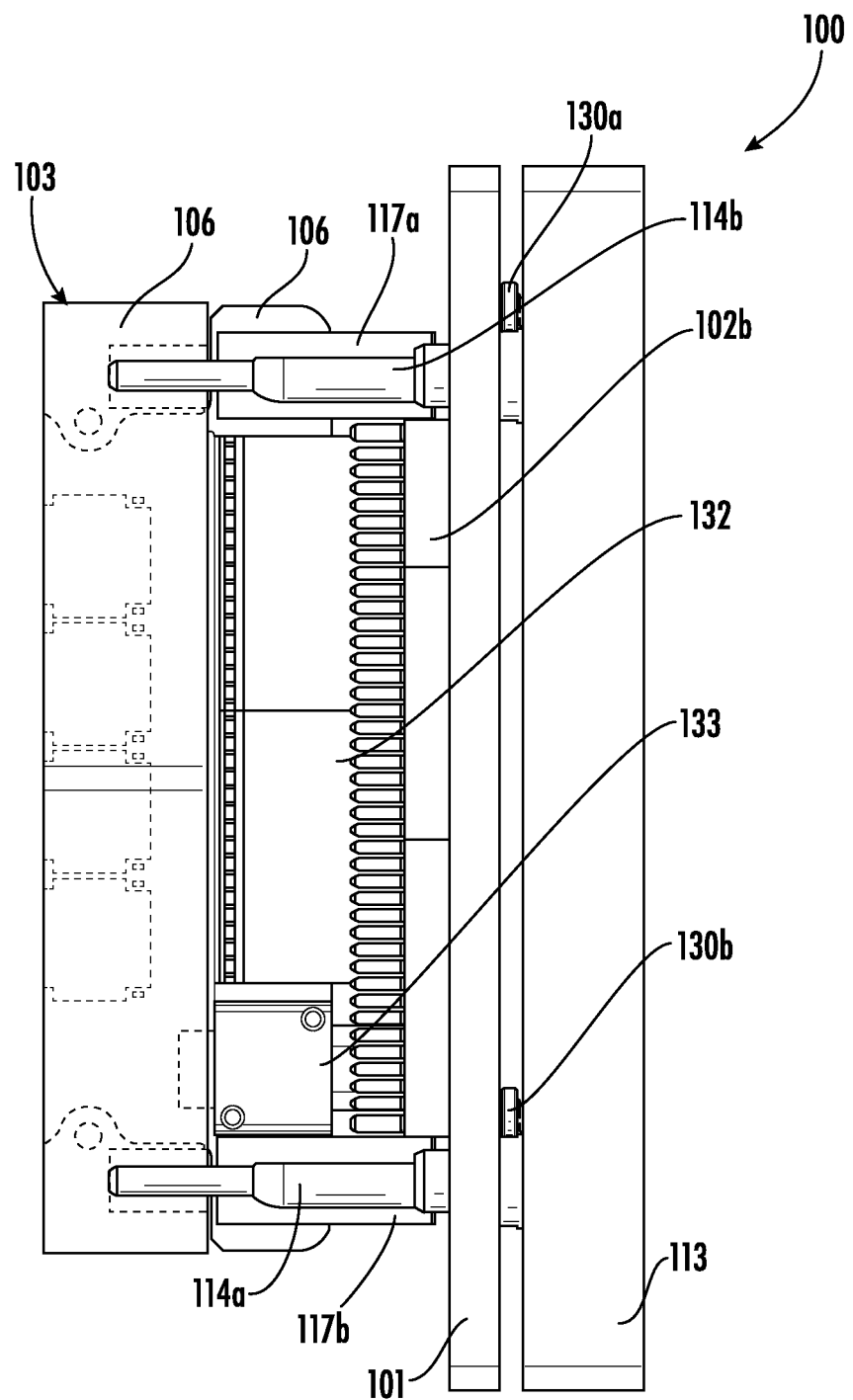
FIG. 3 is a bottom plan view of the circuit board assembly without the cooling fluid arrangement of FIG. 2.
Figure 7:
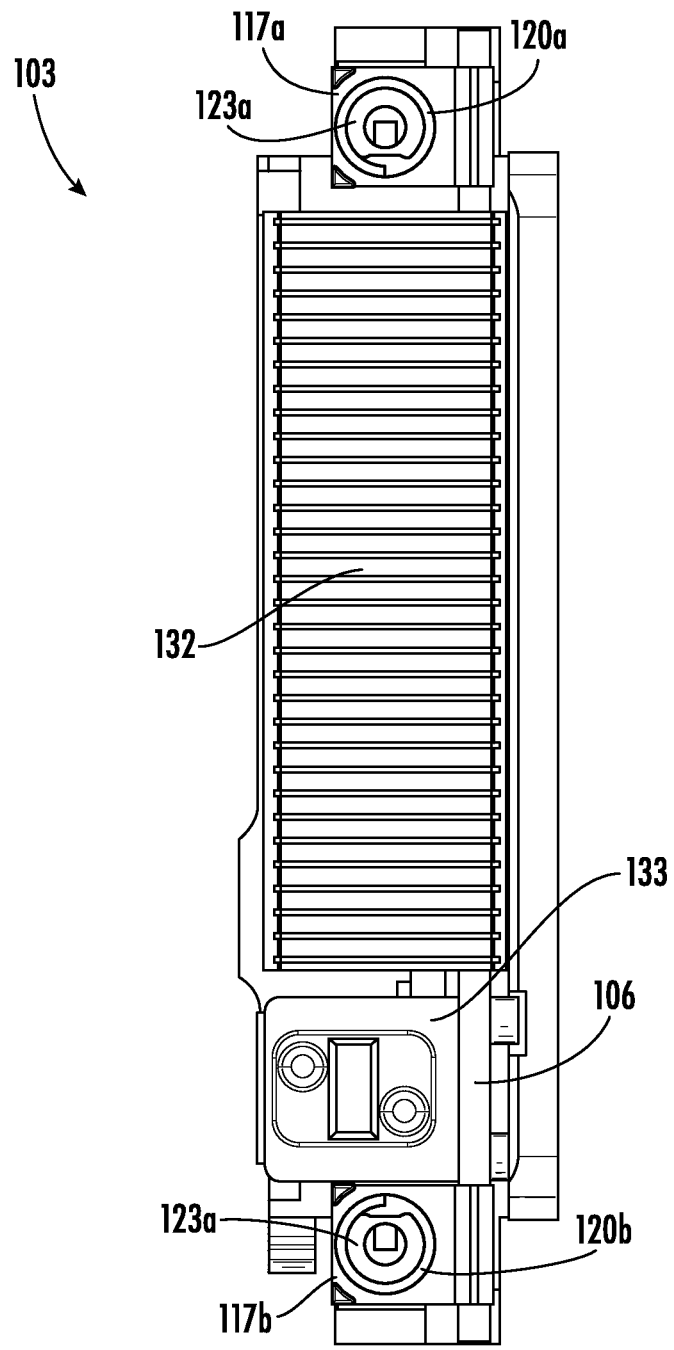
FIG. 7 is a schematic side view of the circuit board assembly of FIG. 2.
Figure 8A:
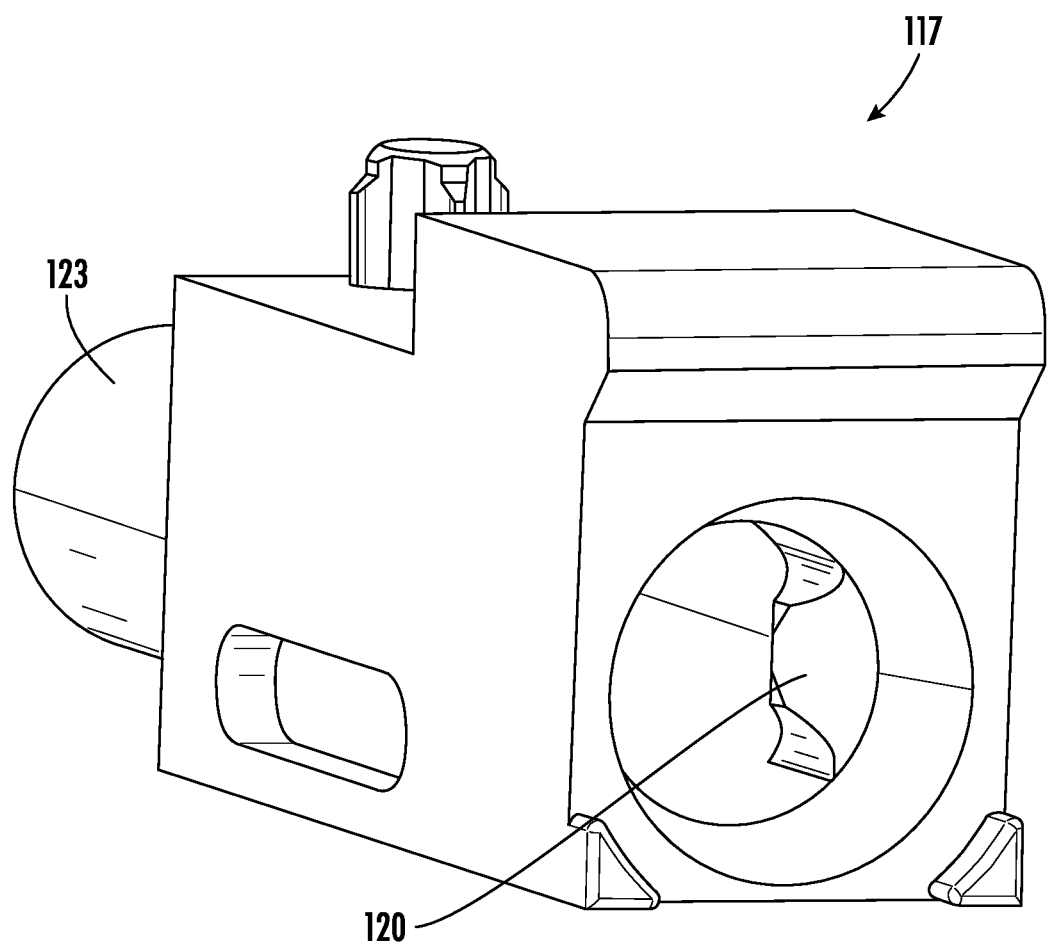
FIGS. 8A-8B are schematic perspective views of a receptacle from the circuit board assembly of FIG. 2.
Figure 8B:
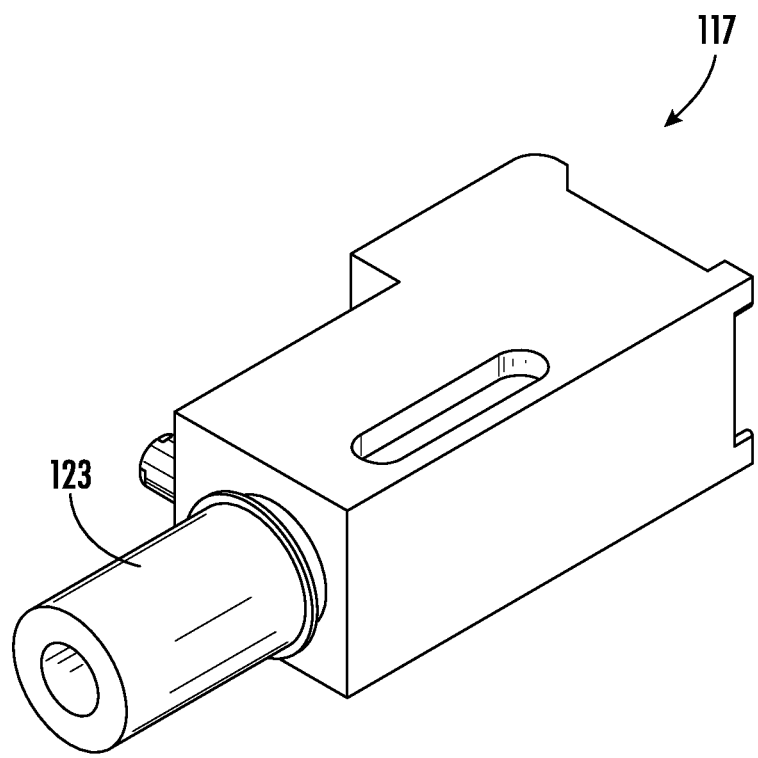
Figure 9:
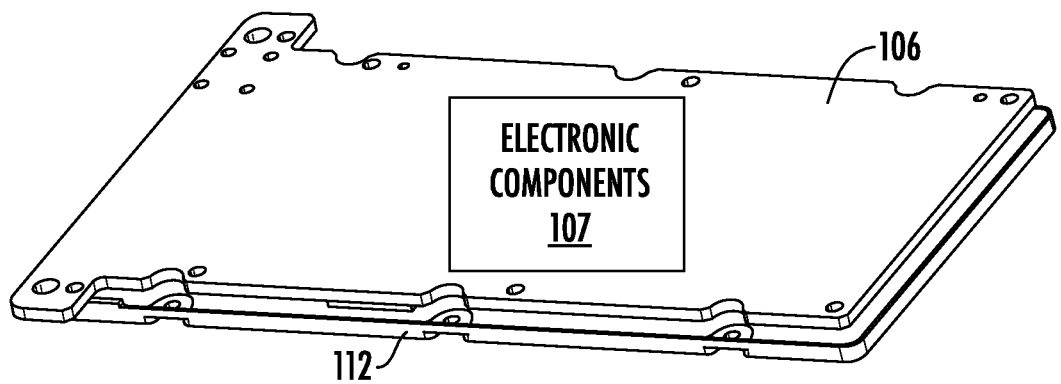
FIG. 9 is a schematic perspective view of the circuit board from the circuit board assembly of FIG. 2.

As perhaps best seen in FIGS. 2 & 7, each circuit board assembly 103a-103d illustratively comprises a male electrical connector 132 for coupling to a respective electrical connector 102a-102b. Also, each circuit board assembly 103a-103d comprises an additional connector 133 (e.g., a fiber optic connector) adjacent the male electrical connector 132 to further illustrate that multiple connector types can be used for interconnecting to the mating backplane connector 102a-102b.

Another aspect is directed to an electronic device 100 comprising a backplane 101 and an electrical connector 102a-102b carried by a front side of the backplane, and a circuit board assembly 103a-103d removably coupled to the electrical connector. The circuit board assembly 103a-103d includes a circuit board 106, a plurality of electronic components 107 carried by the circuit board and generating waste heat, and a cooling fluid arrangement 110 thermally coupled to the plurality of electronic components. The electronic device 100 comprises a cooling fluid manifold 113 behind a back side of the backplane 101, and a pair of cooling fluid tubes 114a-114d extending from the cooling fluid manifold through the backplane and removably coupled to the cooling fluid arrangement 110.

Yet another aspect is directed to a method for making an electronic device 100. The method includes coupling an electrical connector 102a-102b to a front side of a backplane 101, and coupling a cooling fluid manifold 113 behind a back side of the backplane. The method further includes coupling a pair of cooling fluid tubes 114a-114d extending from the cooling fluid manifold 113 through the backplane 101, and removably coupling a circuit board assembly 103a-103d to the electrical connector 102a-102b and the pair of cooling fluid tubes. The circuit board assembly 103a-103d includes a circuit board 106 and a plurality of electronic components 107 carried thereby and generating waste heat, and a cooling fluid arrangement 110 thermally coupled to the plurality of electronic components and removably coupled to the pair of cooling fluid tubes 114a-114d.

It should appreciated that the illustrated embodiment includes the exemplary arrangement of the pair of cooling fluid tubes 114a-114d being carried by the cooling fluid manifold 113, and each circuit board assembly 103a-103d carrying the pair of receptacles 117a-117b. In other embodiments, a reversed arrangement is envisioned; the circuit board assembly 103a-103d may carry the pair of cooling fluid tubes 114a-114d, and the cooling fluid manifold 113 may carry the pair of receptacles 117a-117b.

Figure 10:
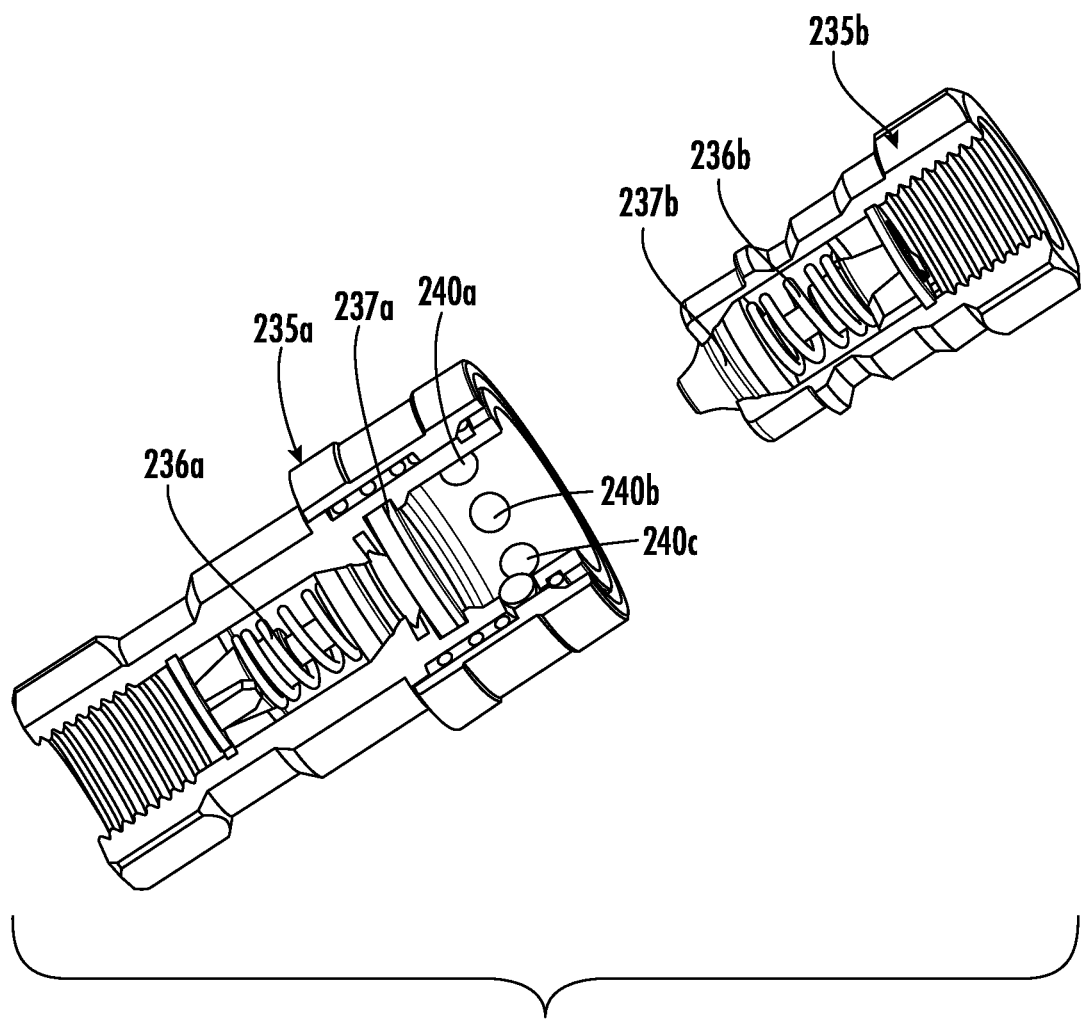
FIG. 10 is a schematic cutaway view of an example embodiment of a fluid flow valve from the circuit board assembly of FIG. 2.
Figure 11:
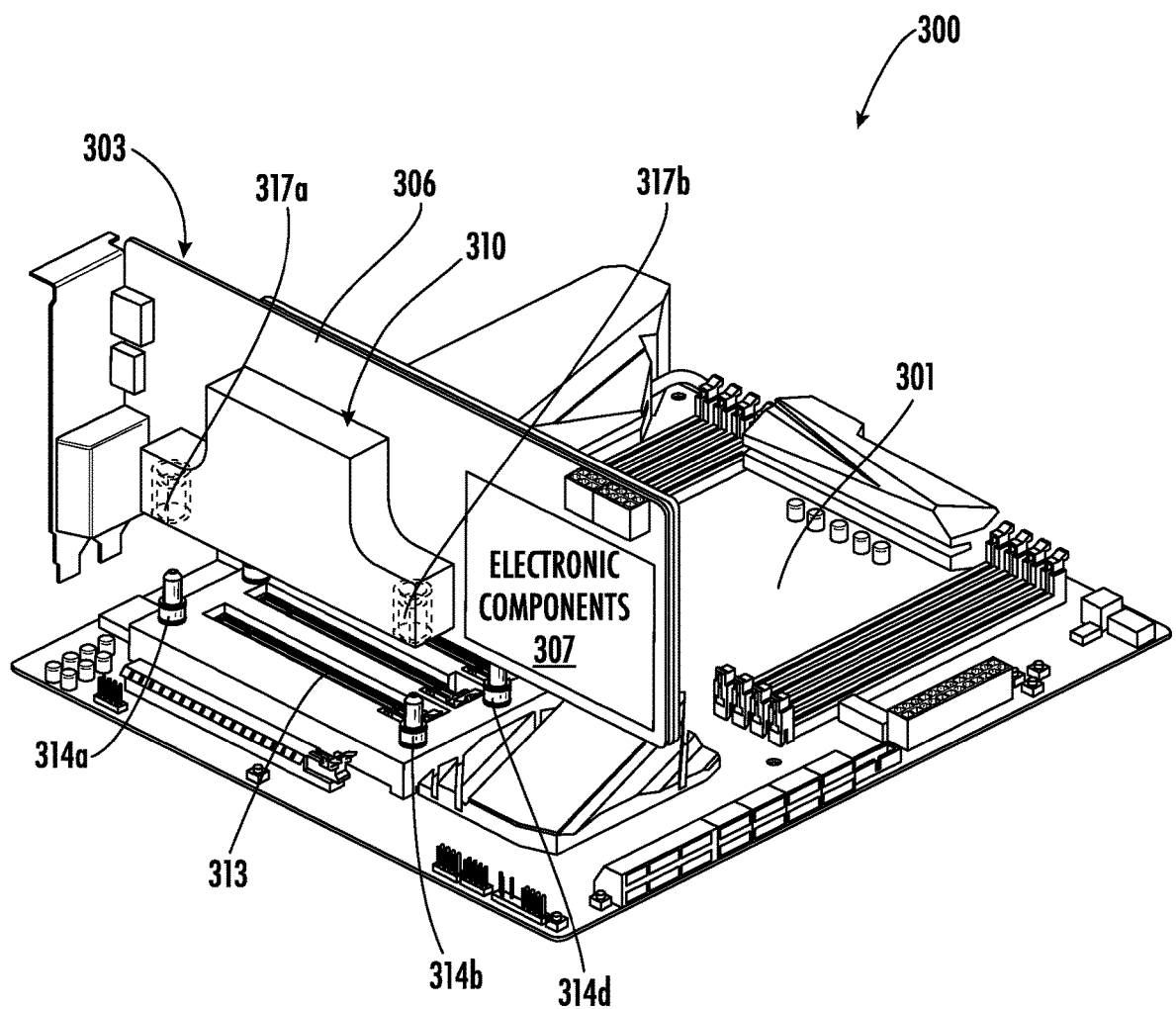
FIG. 11 is a schematic perspective view of an electronic device, according to the present disclosure.
Figure 12:
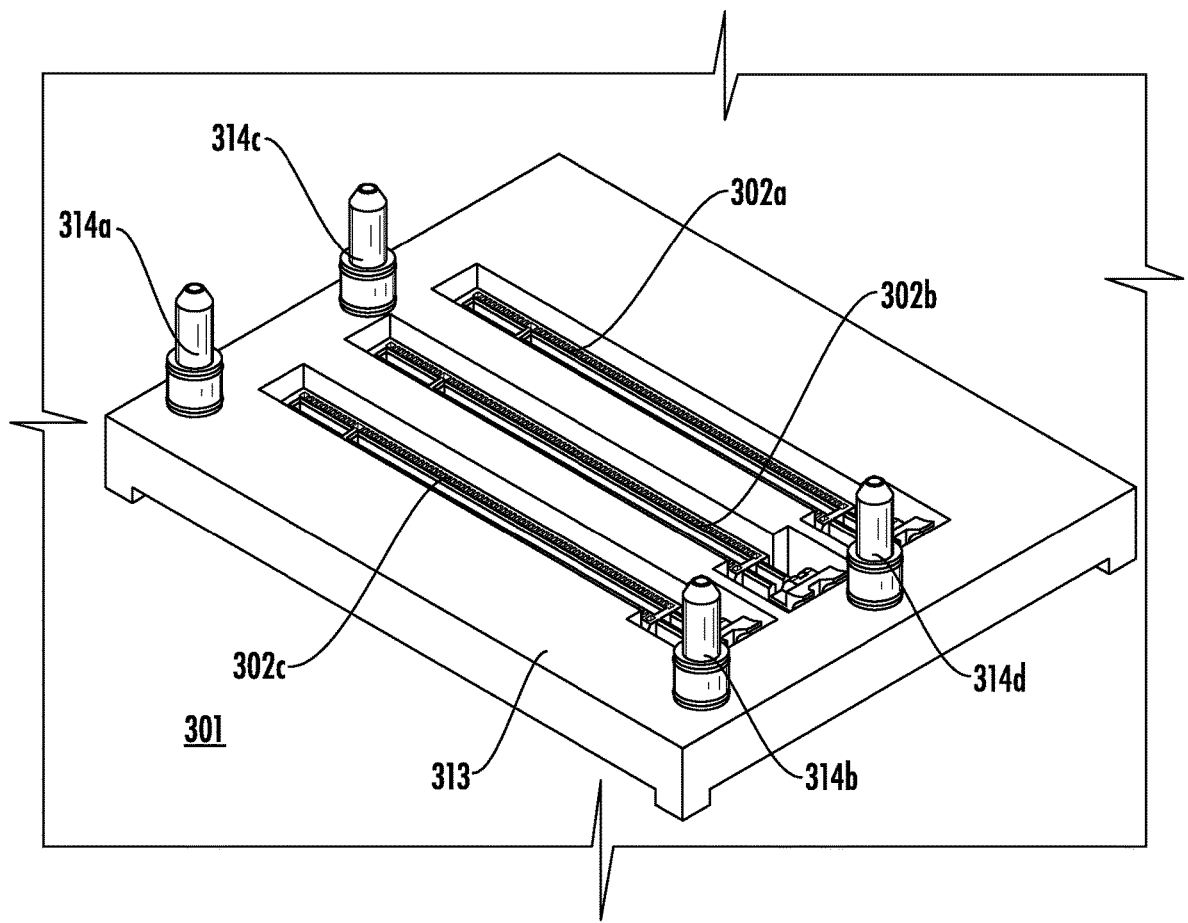
FIG. 12 is a schematic perspective view of a cooling fluid manifold from the electronic device of FIG. 11.

Referring now additionally to FIG. 10, first and second fluid flow valves 235a-235b for another embodiment of the electronic device 100 are now described. In this embodiment of the electronic device, those elements already discussed above with respect to FIGS. 1-9 are incremented by 100 and most require no further discussion herein. This embodiment differs from the previous embodiment in that this electronics device comprises a first fluid flow valve 235a in each cooling fluid port 123a-123b to permit decoupling without fluid leakage, and a second fluid flow valve 235b in each cooling fluid tube 114a-114d to permit decoupling without fluid leakage.

The first fluid flow valve 235a illustratively couples to the second fluid flow valve 235b. The first fluid flow valve 235a illustratively includes a spring device 236a, and a valve receptacle 237a coupled thereto. On the other end, the second fluid flow valve 235b illustratively includes a spring device 236b, and a valve insert 237b coupled thereto. The first fluid flow valve 235a illustratively includes a plurality of spring loaded ball bearings to retain the second fluid flow valve 235b.

Advantageously, the electronic device 100 provides for an easy and flexible fluid cooling approach for rack mounted circuit boards. In particular, the cooling fluid manifold 113 is behind the backplane 101, and the pair of cooling fluid tubes 114a-114d extend therethrough. Because of this, there is still easy access to the housing 104 and the rack mounted circuit board assemblies 103a-103d. In contrast, the VITA 48.4 liquid cooling approach uses a manifold within the housing, which impedes access and complicates chassis fabrication. The VITA 48.4 specification does not disclose the interface or other constituents (e.g., heat exchanger, pumps, etc.) that make up the complete thermal system—it only focuses on the interface to the plug-in modules. Helpfully, the electronic device 100 is agnostic to the housing and provides the flexibility of different second and third tier thermal elements and how they integrate into an overall architecture.

Referring now additionally to FIGS. 11-14, another embodiment of the electronic device 300 is now described. In this embodiment of the electronic device 300, those elements already discussed above with respect to FIGS. 1-9 are incremented by 200 and most require no further discussion herein. This embodiment differs from the previous embodiment in that this electronic device 300 comprises a commercial motherboard form factor. Also, in this embodiment, the cooling fluid manifold 313 abuts (i.e., to be adjacent to) the backplane 301 (i.e., the motherboard) from the front side (i.e., the primary side) of the backplane. As perhaps best seen in FIG. 12, the fluid manifold 313 is adjacent the plurality of electrical connectors 302a-302c.

Figure 13:
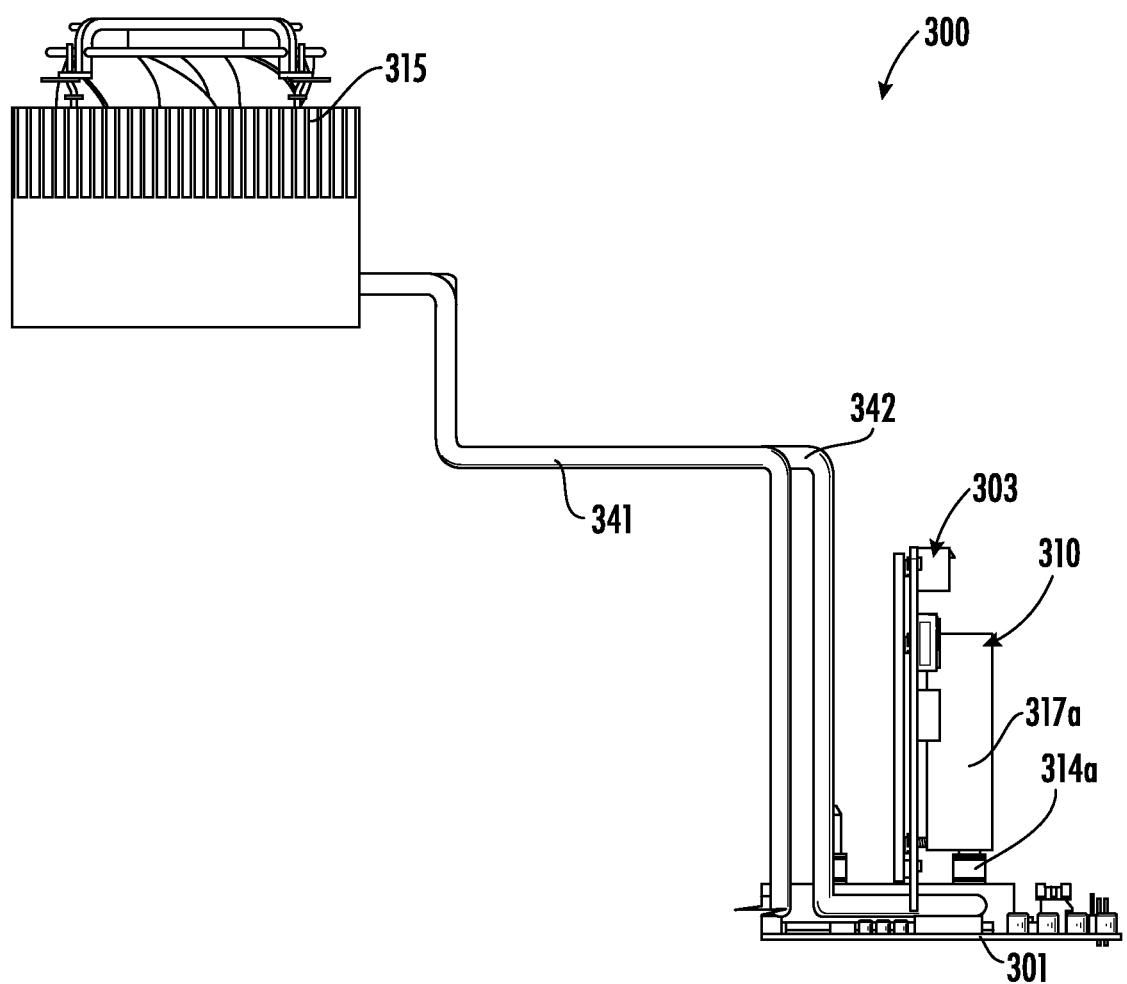
FIG. 13 is a schematic side view of the electronic device of FIG. 11.

As shown in FIG. 13, the electronic device 300 illustratively includes a heat exchanger 315 coupled to the cooling fluid manifold 313, a positive flow conduit 342 providing cooling fluid from the heat exchanger 315, and a return flow conduit 341 transmitting heated fluid to the heat exchanger. Each respective pair of cooling fluid tubes 314a-314d is coupled to the positive flow conduit 342 and the return flow conduit 341.

Figure 14:
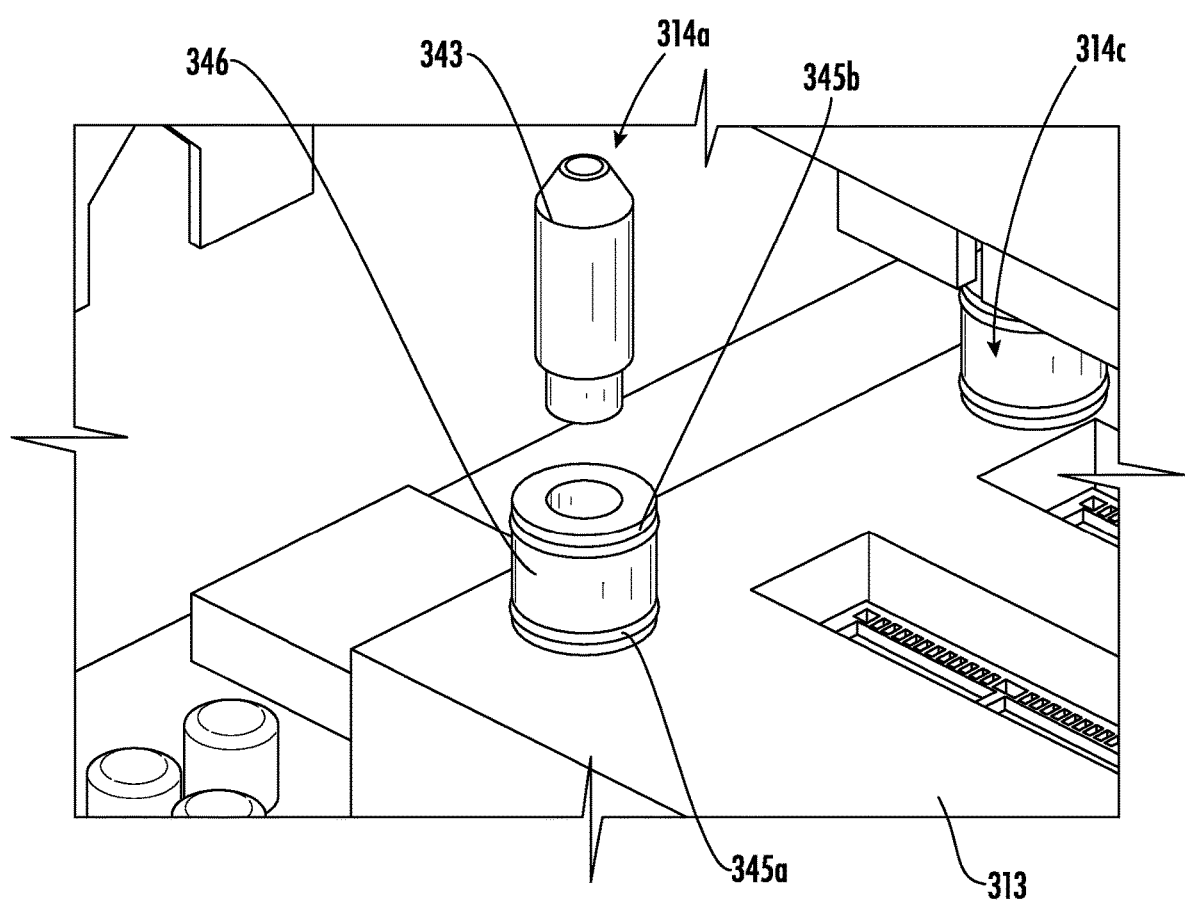
FIG. 14 is a schematic perspective view of a cooling tube and the cooling fluid manifold from the electronic device of FIG. 11.

As perhaps best seen in FIG. 14, each cooling fluid tube 314a-314d comprises a guide pin 343, a compliant interface appliance 346 (e.g., flexible boots) receiving the guide pin, and a pair of retainer rings 345a-345b around the compliant interface appliance. Advantageously, the compliant interface appliance 346 can be used between the guide pin 343 and the fluid manifold 313 to permit additional float between mating plug-in modules due to disparate tolerance variations in mating surfaces. The pair of retainer rings 345a-345b, snap ball-detents, or other hardware features can be used to provide mechanical retention of the cooling fluid tubes 314a-314d. Advantageously, the electronic device 300 may permit traditional and liquid flow through (LFT) components to be integrated together in the same system, thereby providing flexible application with extensibility for both standard and custom features.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
   a backplane and an electrical connector carried by a front side of the backplane;
   a circuit board assembly removably coupled to said electrical connector and comprising
      a circuit board and a plurality of electronic components carried thereby and generating waste heat, and
      a cooling fluid arrangement thermally coupled to said plurality of electronic components;
   a cooling fluid manifold; and
   a pair of cooling fluid tubes extending between said cooling fluid manifold and said cooling fluid arrangement, said pair of cooling fluid tubes having keyed outer surfaces;
   said circuit board assembly comprising a pair of receptacles defining keyed passageways to receive said pair of cooling fluid tubes with the keyed outer surfaces that match.

2. The electronic device of claim 1 wherein said cooling fluid manifold is behind a back side of said backplane; wherein said pair of cooling fluid tubes extends from said cooling fluid manifold through said backplane; and wherein said pair of cooling fluid tubes is removably coupled to said cooling fluid arrangement.

3. The electronic device of claim 1 wherein said cooling fluid manifold is adjacent to the front side of said backplane.

4. The electronic device of claim 1 wherein said pair of cooling fluid tubes is rotatably mounted to said cooling fluid manifold.

5. The electronic device of claim 4 wherein the keyed outer surfaces and the keyed passageways are associated with a given electronic function from among a plurality of different electronic functions based upon a selective rotation.

6. The electronic device of claim 1 wherein said cooling fluid arrangement comprises:
   a heat sink defining a cooling fluid cavity therein; and
   a pair of cooling fluid ports extending from said heat sink and removably coupled to said pair of cooling fluid tubes.

7. The electronic device of claim 6 comprising a first fluid flow valve in each cooling fluid port to permit decoupling without fluid leakage.

8. The electronic device of claim 1 comprising a second fluid flow valve in each cooling fluid tube to permit decoupling without fluid leakage.

9. The electronic device of claim 1 comprising a housing surrounding said circuit board assembly; and opposing guide rails carried by said housing to slidably receive said circuit board assembly.

10. The electronic device of claim 1 further comprising a heat exchanger coupled to said cooling fluid manifold.

11. An electronics cabinet comprising:
    a backplane and a plurality of electrical connectors carried by a front side of the backplane;
    a plurality of circuit board assemblies removably coupled respectively to said plurality of electrical connectors, each circuit board assembly comprising a circuit board and a plurality of electronic components carried thereby and generating waste heat, and a cooling fluid arrangement thermally coupled to said plurality of electronic components;

a housing surrounding said plurality of circuit board assemblies;

opposing guide rails carried by said housing to slidably receive said plurality of circuit board assemblies;

a cooling fluid manifold; and a plurality of cooling fluid tube pairs extending between said cooling fluid manifold and said cooling fluid arrangement, each cooling fluid tube pair having keyed outer surfaces;

each circuit board assembly comprising a pair of receptacles defining keyed passageways to receive a respective cooling fluid tube pair of the plurality of cooling fluid tube pairs with the keyed outer surfaces that match.

12. The electronics cabinet of claim 11 wherein each circuit board assembly comprises an aviation circuit board assembly; wherein said cooling fluid manifold is behind a back side of said backplane; wherein said plurality of cooling fluid tube pairs extends from said cooling fluid manifold through said backplane; and wherein each cooling fluid tube pair is removably coupled to said cooling fluid arrangement.

13. The electronics cabinet of claim 11 wherein said cooling fluid manifold is adjacent to the front side of said backplane.

14. The electronics cabinet of claim 11 wherein each cooling fluid tube pair is rotatably mounted to said cooling fluid manifold.

15. The electronics cabinet of claim 14 wherein the keyed outer surfaces and the keyed passageways are associated with a given electronic function from among a plurality of different electronic functions based upon a selective rotation.

16. The electronics cabinet of claim 11 wherein said cooling fluid arrangement comprises:

a heat sink defining a cooling fluid cavity therein; and a pair of cooling fluid ports extending from the heat sink and removably coupled to the respective cooling fluid tube pair of the plurality of cooling fluid tube pairs.

17. The electronics cabinet of claim 16 comprising a first fluid flow valve in each cooling fluid port to permit decoupling without fluid leakage.

18. The electronics cabinet of claim 11 comprising a second fluid flow valve in each cooling fluid tube to permit decoupling without fluid leakage.

19. A method for making an electronic device, the method comprising:

coupling an electrical connector to a front side of a backplane;

coupling a cooling fluid manifold to the backplane;

coupling a pair of cooling fluid tubes extending from the cooling fluid manifold; and removably coupling a circuit board assembly to the electrical connector and the pair of cooling fluid tubes, the circuit board assembly comprising a circuit board and a plurality of electronic components carried thereby and generating waste heat, and a cooling fluid arrangement thermally coupled to the plurality of electronic components and removably coupled to the pair of cooling fluid tubes, the pair of cooling fluid tubes having keyed outer surfaces, the circuit board assembly comprising a pair of receptacles defining keyed passageways to receive the pair of cooling fluid tubes with the keyed outer surfaces that match.

20. The method of claim 19 wherein the cooling fluid manifold is behind a back side of the backplane; and wherein the pair of cooling fluid tubes extends from the cooling fluid manifold through the backplane.

21. The method of claim 19 wherein the cooling fluid manifold is adjacent to the front side of the backplane.

22. The method of claim 19 further comprising rotatably mounting the pair of cooling fluid tubes to the cooling fluid manifold.

23. The method of claim 22 wherein the keyed outer surfaces and the keyed passageways are associated with a given electronic function from among a plurality of different electronic functions based upon a selective rotation.

24. The method of claim 19 wherein the cooling fluid arrangement comprises:

a heat sink defining a cooling fluid cavity therein; and a pair of cooling fluid ports extending from the heat sink and removably coupled to the pair of cooling fluid tubes.

25. The method of claim 24 comprising coupling a first fluid flow valve in each cooling fluid port to permit decoupling without fluid leakage.

\* \* \* \* \*